(12) United States Patent
Stoll et al.

(10) Patent No.: US 9,362,438 B2
(45) Date of Patent: Jun. 7, 2016

(54) OPTOELECTRONIC SEMICONDUCTOR COMPONENT AND MODULE WITH A PLURALITY OF SUCH COMPONENTS

(75) Inventors: Ion Stoll, Tegernheim (DE); Kirstin Petersen, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 141 days.

(21) Appl. No.: 14/345,645

(22) PCT Filed: Aug. 16, 2012

(86) PCT No.: PCT/EP2012/066037
§ 371 (c)(1),
(2), (4) Date: Oct. 7, 2014

(87) PCT Pub. No.: WO2013/041314
PCT Pub. Date: Mar. 28, 2013

(65) Prior Publication Data
US 2015/0022762 A1 Jan. 22, 2015

(30) Foreign Application Priority Data

Sep. 20, 2011 (DE) .......................... 10 2011 113 802

(51) Int. Cl.
*H01L 31/16* (2006.01)
*G02F 1/1335* (2006.01)
*H01L 33/50* (2010.01)
(Continued)

(52) U.S. Cl.
CPC ............ *H01L 31/16* (2013.01); *C09K 11/7774* (2013.01); *G02B 6/0026* (2013.01); *G02B 6/0073* (2013.01); *G02F 1/1336* (2013.01);
*H01L 33/504* (2013.01); *G02F 1/133617* (2013.01); *H01L 2924/0002* (2013.01)

(58) Field of Classification Search
None
See application file for complete search history.

(56) References Cited

U.S. PATENT DOCUMENTS

| 2006/0244358 A1 | 11/2006 | Kim et al. |
| 2008/0187746 A1 | 8/2008 | De Graaf et al. |
| 2009/0015137 A1 | 1/2009 | Su et al. |

(Continued)

FOREIGN PATENT DOCUMENTS

| DE | 102005061828 A1 | 1/2007 |
| EP | 0936682 A1 | 8/1999 |

(Continued)

OTHER PUBLICATIONS

Murai, S. et al. "Enhanced absorption and emission of $Y_3Al_5O_{12}$: $Ce^{3+}$ thin layers prepared by epoxide-catalyzed sol-gel method," Optical Materials Express, Aug. 1, 2012, pp. 1111-1120, vol. 2, No. 8.

*Primary Examiner* — Ashok Patel
(74) *Attorney, Agent, or Firm* — McDermott Will & Emery LLP

(57) ABSTRACT

The invention relates to a semi-conductor component, comprising a semi-conductor chip (1) which has an active layer (1a) suitable for generating radiation and suitable for emitting radiation in the blue wavelength range. A first converter (3a) comprising a Ce doping is arranged downstream of the semiconductor chip (1) in the emission direction. In addition, a second converter (3b) comprising a minimum Ce doping of 1.5% is arranged downstream of the semiconductor chip (1) in the emission direction. The invention further relates to a module with a plurality of such components.

11 Claims, 1 Drawing Sheet

Figure 1:
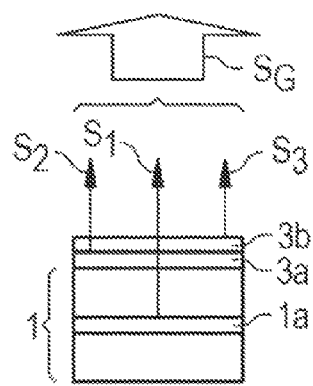

(51) Int. Cl.
*C09K 11/77* (2006.01)
*F21V 8/00* (2006.01)

(56) References Cited

U.S. PATENT DOCUMENTS

| | | | |
|---|---|---|---|
| 2009/0091237 A1* | 4/2009 | Hiroaki | C09K 11/0883 313/495 |
| 2010/0224895 A1 | 9/2010 | Murazaki et al. | |
| 2011/0049550 A1 | 3/2011 | Katsuno et al. | |
| 2011/0156071 A1* | 6/2011 | Cheng | H01L 33/44 257/98 |
| 2012/0068213 A1* | 3/2012 | Zhang | B32B 18/00 257/98 |
| 2012/0217865 A1* | 8/2012 | Cabalu | H01J 1/63 313/483 |
| 2013/0009541 A1* | 1/2013 | Zheng | C09K 11/0883 313/503 |

FOREIGN PATENT DOCUMENTS

| | | |
|---|---|---|
| EP | 1854863 A1 | 11/2007 |
| EP | 2339655 A2 | 6/2011 |
| JP | 2004529252 A | 9/2004 |
| JP | 2006265542 A | 10/2006 |
| JP | 2007197608 A | 8/2007 |
| WO | WO-9805078 A1 | 2/1998 |
| WO | 2007/080555 A1 | 7/2007 |

* cited by examiner

OPTOELECTRONIC SEMICONDUCTOR COMPONENT AND MODULE WITH A PLURALITY OF SUCH COMPONENTS

The invention relates to an optoelectronic component comprising a semiconductor chip, a first converter and a second converter. The present invention furthermore relates to a module comprising a plurality of such semiconductor components.

The document US 2008/0187746 describes an optoelectronic component.

It is an object of the present invention to specify an optoelectronic semiconductor component which is suitable for backlighting and has a maximum brightness and at the same time an increased color gamut, a low production outlay being required.

In accordance with at least one embodiment of the optoelectronic semiconductor component, the optoelectronic semiconductor component comprises a semiconductor chip, wherein the semiconductor chip has an active layer suitable for generating radiation and suitable for emitting radiation in the blue wavelength range. By way of example, the semiconductor chip is a laser diode chip or a light-emitting diode chip.

A first converter comprising a Ce doping is disposed downstream of the semiconductor chip in the emission direction, and a second converter comprising a Ce doping of at most 1.5% is disposed downstream of the semiconductor chip in the emission direction, wherein the first converter has a higher Ce doping than the second converter.

The converters each comprise a phosphor, for example, which can be embedded into a matrix material. However, the phosphor can also be present as a solid body. The corresponding converter then consists of the phosphor. Furthermore, it is possible for the phosphor to be present in the form of particles distributed in the matrix material. The phosphor comprises the doping with Ce. The matrix material can be, for example, glass, ceramic material or a plastic material such as silicone.

By means of the second converter having a reduced Ce doping, the emission spectrum emitted by the semiconductor component can advantageously be optimized to the eye sensitivity of the human eye. In this case, the absorption spectrum of the second converter changes only slightly as a result of the reduction of the Ce doping. By means of the first converter having a high Ce doping, the color gamut or the color locus of the emitted radiation can advantageously be optimized. A combination of the first converter and the second converter makes it possible, in particular, overall to cover a large color space, the emission spectrum simultaneously being optimized to the eye sensitivity and a suitable color locus. Overall, a maximum brightness can thus be achieved, without losses occurring as a result of different absorption properties of the converters. Moreover, advantageously there is no need for readjustment at different excitation wavelengths of different, product-identical semiconductor chips, as a result of which the production outlay is advantageously reduced.

The "color locus" is understood hereinafter to mean, in particular, the numerical values which describe the color of the emitted light of the semiconductor chips or of the semiconductor component in the CIE color space.

The "CIE color space" is, in particular, the CIE standard colorimetric system (also known as CIE 1931). The CIE standard colorimetric system is based on measurement values which are related to a standard observer and which can be represented in a CIE standard chromaticity diagram. The area of possible colors is plotted on a coordinate system in the CIE standard chromaticity diagram, on which system the x-component and y-component of an arbitrary color can be read off directly.

In accordance with at least one embodiment, the first converter has a dominant wavelength in a range of between 565 nm and 575 nm inclusive, and the second converter has a dominant wavelength in a range of between 550 nm and 560 nm inclusive. In this case, the dominant wavelengths are advantageously selected in such a way that the first converter is selected for correcting the color locus and the second converter is selected for adaptation to the eye sensitivity of the human eye. In this case, the second converter covers a large color space and emits at a dominant wavelength that is optimized to the eye sensitivity. The first converter, by contrast, is used only for correcting the color locus, such that the semiconductor component is preferably suitable for backlighting purposes. In this case, the semiconductor component is suitable, in particular, for backlighting an LCD panel. In this regard, overall a maximum brightness can be achieved, without losses occurring as a result of different absorption effects and without the need for an increased production outlay owing to readjustment at different excitation wavelengths.

In accordance with at least one embodiment, the optoelectronic semiconductor component comprises a semiconductor chip having an active layer suitable for generating radiation and suitable for emitting radiation in the blue wavelength range. A first converter comprising a Ce doping of at least 2.5%, in particular at least 3%, preferably at least 4%, is disposed downstream of the semiconductor chip in the emission direction. Moreover, a second converter comprising a Ce doping of at most 1.5%, in particular of at most 1%, is disposed downstream of the semiconductor chip in the emission direction.

Preferably, the first converter and the second converter have an identical or almost identical absorption spectrum. As a result, it is possible to use an existing converter mixture comprising first converter and second converter for a multiplicity of different product-identical semiconductor chips having a different emission spectrum, without a necessarily required adaptation, wherein the converter mixture in this case is advantageously simultaneously optimized to brightness, color space and color gamut. Moreover, it is possible to generate an increased brightness in the eye sensitivity in conjunction with a color space unchanged in size.

Preferably, an emission spectrum of the component is realized which is composed of a superposition of the individual emitted and converted spectra of the semiconductor chip and of the converters, respectively, and which is advantageously tuned to the conventional LCD filter systems. This enables a maximum brightness and an increased color gamut for backlighting screens, for example.

The first and second converters are disposed downstream of the semiconductor chip in the emission direction. In this case, by way of example, the first converter can be applied directly on a radiation coupling-out area of the semiconductor chip, wherein the second converter is applied directly on the first converter. In this case, therefore, the first converter is arranged between semiconductor chip and second converter. Correspondingly, the second converter can be arranged between semiconductor chip and first converter. Alternatively, the first converter and the second converter can be arranged alongside one another on the radiation coupling-out area of the semiconductor chip. In this case, the radiation emitted by the semiconductor chip passes either through the first converter or through the second converter. As a further alternative, the first converter and the second converter can be mixed with one another and integrated in one another, such that the first converter and the second converter are not embodied as a separate layer.

The semiconductor component is an optoelectronic component which enables electrically generated data or energies to be converted into light emission, or vice versa. The semiconductor component comprises at least one optoelectronic semiconductor chip, preferably a radiation-emitting semiconductor chip. The semiconductor chip is preferably an LED (light-emitting diode), particularly preferably a thin-film LED. In the case of thin-film LEDs, in particular a growth substrate on which layers of the semiconductor chip had been grown epitaxially has been partly or completely detached.

The semiconductor chip comprises a semiconductor layer stack containing the active layer. The active layer preferably contains a pn junction, a double heterostructure, a single quantum well (SQW) structure or a multi-quantum well (MQW) structure for generating radiation. In this case, the designation quantum well structure does not exhibit any significance with regard to the dimensionality of the quantization. It encompasses, inter alia, quantum wells, quantum wires and quantum dots and any combinations of these structures.

The semiconductor layer stack of the semiconductor chip preferably contains a III/V semiconductor material. III/V semiconductor materials are particularly suitable for generating radiation in the ultraviolet, through the visible to the infrared spectral range.

In accordance with at least one embodiment, the first converter converts at least part of the radiation emitted by the semiconductor chip into radiation in the yellow and/or yellow-orange wavelength range. Preferably, the second converter converts at least part of the radiation emitted by the semiconductor chip into radiation in the green or yellow-green wavelength range.

The first and second converters accordingly both convert part of the blue radiation emitted by the semiconductor chip into radiation having a different wavelength. In particular, use is made of a converter mixture comprising a lightly Ce-doped converter having a greenish color locus and a heavily Ce-doped converter having a yellowish or yellow-orange color locus. In this case, advantageously, the optimum ratio is set between the green proportion, which is suitable for increasing the brightness, and a wide wavelength distribution of the yellow or yellow-orange proportion, which ensures the largest possible color space. This converter mixture can advantageously be used for a wide range of semiconductor chip wavelengths, without necessarily having to be readapted.

Preferably, the first and second converters are in each case suitable for converting part of the radiation emitted by the semiconductor chip into radiation having at least one other wavelength. Another part of the radiation emitted by the semiconductor chip can be transmitted without being converted. For this purpose, the converter can comprise for example a matrix material which is transmissive to blue radiation.

Transmitted without being converted means in this case that the radiation emitted by the semiconductor chip remains at least proportionally uninfluenced by the first or respectively second converter, such that this proportion of the radiation leaves the converter as blue radiation. The converters are accordingly not suitable for complete conversion, but rather only convert part of the radiation emitted by the semiconductor chip.

In accordance with at least one embodiment, the first converter is a YAG or TAG converter, and the second converter is a YAG converter. Preferably, the first converter has a dominant wavelength in a range of between 565 nm and 575 nm inclusive, preferably of 571 nm. Particularly preferably, the second converter has a dominant wavelength in a range of between 550 nm and 560 nm inclusive, preferably of 555 nm.

The dominant wavelength is also designated as the perceived wavelength. It identifies the hue-equivalent wavelength perceived by the human eye during observation.

The wavelength ranges of the converters that are indicated in this application are, in particular, ranges in which the respective converter has its dominant wavelength. That means that the emission spectrum of the first and second converters can likewise have a spectral profile outside the wavelength ranges indicated, but the emission maximum falls in each case within the range indicated.

In accordance with at least one embodiment, the dominant wavelength of the second converter is adapted to the eye sensitivity of the human eye. Preferably, the dominant wavelength of the first converter is suitable for correcting the color locus. In this case, the second converter covers a large color space and emits at a dominant wavelength which is optimized to the eye sensitivity. The first converter, by contrast, is used only for correcting the color locus, such that the semiconductor component is preferably suitable for backlighting purposes. In this case, the semiconductor component is suitable, in particular, for backlighting an LCD panel. In this regard, overall a maximum brightness can be achieved, without losses occurring as a result of different absorption effects and without the need for an increased production outlay owing to a readjustment at different excitation wavelengths.

For backlighting screens such as, for example, televisions and computer monitors, use is often made of LEDs, with LCD filters disposed downstream thereof in the emission direction. In this case, different requirements are made of the LEDs. Firstly a maximum brightness of the LEDs and secondly a large color gamut are expected. The properties of the LEDs can be adapted by means of different converters disposed downstream of the LEDs in the emission direction. However, the desired properties such as, for example, brightness and color gamut usually behave antithetically to one another. By way of example, a mixture of a green and a red converter does not have the brightness of yellow converters, but has a larger color gamut than yellow converters.

Desired requirements made of the LEDs usually include a cold-white color locus and a maximum brightness in eye perception with a color gamut of approximately 72% of the area relative to the NTSC color space. For this purpose, narrowband blue-emitting semiconductor chips are usually used, the light proportions of which is converted into light in the yellow and red wavelength range by means of a converter, such that white light arises. In this case, however, deviations in the brightness and the color locus of the product-identical LEDs can arise as a result of production fluctuations. On account of these production fluctuations, the quantity of the converter used is usually disadvantageously adapted to the respective wavelength and brightness of the respective semiconductor chip.

For backlightings, use is often made of YAG-based converters, for example a $Y_3Al_5O_{12}:Ce^{3+}$-based or a $Y_3(Ga_xAl_{1-x})O_{12}:Ce^{3+}$-based converter. These have a wide emission spectrum, wherein the emission wavelength covers a sufficient area in the color space and is near the eye sensitivity. The brightness with respect to the eye sensitivity can additionally be increased by the addition of a second converter having a green color locus. An $Lu_3Al_5O_{12}:Ce^{3+}$-based or a $Y_3(Ga_xAl_{1-x})O_{12}:Ce^{3+}$-based converter is suitable for this purpose. The emission can thus be optimized to the eye sensitivity. However, the yttrium-based converter and the lutetium-based converter differ in their absorption maxima. That disadvantageously has the effect that the ratio of the converters has to be adapted for different excitation wavelengths, which leads to an increased production outlay.

In accordance with at least one embodiment, the first and/or second converter are/is in each case a $Y_3Al_5O_{12}:Ce^{3+}$-based converter.

In accordance with at least one embodiment, the first converter and/or the second converter are/is embodied as converter lamina(e). Converter laminae comprise, for example, a matrix material with the phosphors embedded therein. By means of a layer transfer, for example, the separately produced converter laminae can be applied to the semiconductor chips. Such converter laminae are also known to the person skilled in the art by the term phosphor layer.

In accordance with at least one embodiment, the first converter and the second converter form a common converter mixture. By way of example, the first converter and the second converter are embedded in a common matrix material. In this case, the first and second converters preferably do not form separate layers, but rather are preferably homogeneously mixed with one another. In other words, therefore, a converter mixture, embodied for example as a converter lamina, is disposed downstream of the semiconductor chip in the emission direction, said converter mixture comprising the first and second converters.

In accordance with at least one embodiment, a module comprises a plurality of semiconductor components comprising a semiconductor chip, a first converter and a second converter. Preferably, the semiconductor components are arranged on a common carrier substrate. Particularly preferably, an optical element is disposed downstream of the semiconductor components in the emission direction. Preferably, the radiation emitted by the semiconductor chip and the radiation converted by the converters are coupled into the optical element. The spectral constituents of the converted and unconverted radiations can thus be mixed in the optical element, such that white light advantageously arises.

In accordance with at least one embodiment, the optical element is an optical waveguide. Said optical waveguide is preferably suitable for the backlighting of televisions and computer monitors or other screens. Preferably, the optical waveguide is embodied in such a way that a homogeneous emission characteristic is obtained. For this purpose, the optical waveguide contains scattering centers, for example, which are preferably suitable for scattering the spectral constituents coupled into the optical waveguide homogeneously in all spatial directions.

The module is preferably used for backlighting a screen, for example.

Figure 2:
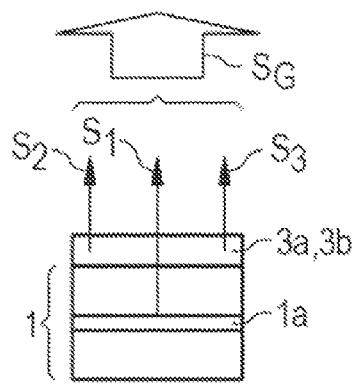
Figure 3:
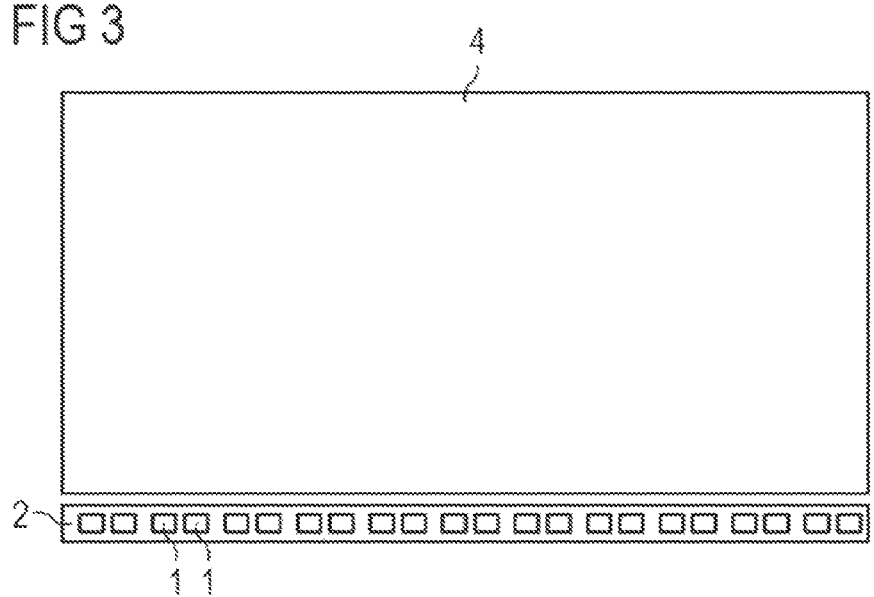

Further advantages and advantageous developments of the invention will become apparent from the exemplary embodiments described below in conjunction with FIGS. 1 to 3, in which:

FIGS. 1, 2 each show a schematic cross section of an exemplary embodiment of a semiconductor component according to the invention, and FIG. 3 shows a schematic cross section of an exemplary embodiment of a module according to the invention.

In the figures, identical or identically acting constituent parts may be provided in each case with the same reference signs. The illustrated constituent parts and their size relationships among one another should not be regarded as true to scale. Rather, individual constituent parts such as, for example, layers, structures, components and regions may be illustrated with exaggerated thickness or size dimensions in order to enable better illustration and/or in order to afford a better understanding.

FIG. 1 shows a cross section of an exemplary embodiment of a semiconductor component comprising a semiconductor chip 1. The semiconductor chip 1 has an active layer 1a suitable for generating radiation and suitable for emitting radiation in the blue wavelength range. The semiconductor chip 1 has a semiconductor layer sequence based on a III/V semiconductor material. In this case, the active layer 1a is integrated in the semiconductor layer sequence. The semiconductor chip 1 is preferably an LED.

A first converter 3a is disposed downstream of the semiconductor chip 1 in the emission direction, said first converter being suitable for converting radiation in the blue wavelength range into radiation in the yellow and/or yellow-orange wavelength range. The first converter 3a comprises a Ce doping of at least 4%, in particular of 4% or more. Preferably, the first converter is a YAG (yttrium aluminum oxide) converter or a TAG converter. The first converter 3a is, in particular, a $Y_3Al_5O_{12}:Ce^{3+}$-based converter. Preferably, the first converter 3a has a dominant wavelength in a range of between 565 nm and 575 nm inclusive, preferably 571 nm.

In the present case, the first converter 3a is embodied as a converter lamina and arranged directly on a radiation coupling-out area of the semiconductor chip 1. For this purpose, by way of example, the converter lamina 3a is produced separately, transferred by means of a layer transfer to the semiconductor chip 1 and fixed there. The first converter 3a preferably converts the radiation emitted by the semiconductor chip 1 partly into radiation in the yellow and/or yellow-orange wavelength range. That means that only a partial conversion takes place in the first converter 3a, such that beams passing through from the first converter 3a comprise both a blue proportion and a yellow and/or yellow-orange proportion. By way of example, up to 50% of the radiation emitted by the active layer 1a of the semiconductor chip 1 is converted into yellow and/or yellow-orange radiation in the first converter 3a and up to 50% is transmitted without being converted as blue radiation.

A second converter 3b is arranged on the first converter 3a and is thus disposed downstream of the semiconductor chip 1 in the emission direction, said second converter likewise being embodied as a converter lamina. The second converter 3b converts part of the blue radiation emitted by the semiconductor chip 1 into radiation in the green wavelength range. Part of the radiation emitted by the semiconductor chip 1 is transmitted without being converted as blue radiation through the second converter 3b. Moreover, the radiation converted by the first converter 3a is preferably transmitted without being converted in the second converter 3b. Consequently, beams passing through from the second converter 3b comprise both a yellow and/or yellow-orange proportion of the radiation converted in the first converter 3a, a green proportion of the radiation converted in the second converter 3b and a blue proportion of the radiation emitted by the semiconductor chip 1. By way of example, once again up to 50% of the radiation emitted by the active layer 1a of the semiconductor chip 1 is converted into green radiation in the second converter 3b.

The second converter 3b is once again preferably a YAG-based converter, preferably a $Y_3Al_5O_{12}:Ce^{3+}$-based phosphor. The second converter 3b has, in particular, a low Ce doping of at most 1%. Preferably, the second converter 3b has a dominant wavelength in a range of 550 nm and 560 nm inclusive, preferably 555 nm.

The converters 3a, 3b each preferably comprise a matrix material in which individual phosphors are embedded. Particularly preferably, the individual phosphors of the converters $3a$, $3b$ are distributed homogeneously in the matrix material, such that an emission characteristic that is as homogeneous as possible can be obtained.

The semiconductor component in FIG. 1 overall emits blue radiation $S_1$, which is emitted by the semiconductor chip 1 and transmitted without being converted, yellow and/or yellow-orange radiation $S_2$, which is converted by the first converter $3a$, and green radiation $S_3$, which is converted by the second converter $3b$. As a result, it is possible to realize a component whose emission spectrum $S_G$ has an increased color space in comparison with the individual semiconductor chip 1 in conjunction with maximum brightness. As a result, such components are suitable, in particular, for backlighting screens, such as televisions and computers, for example.

The use of the above-mentioned converters $3a$, $3b$ advantageously makes it possible to obtain a high color gamut in conjunction with maximum brightness. The combination of the first and second converters $3a$, $3b$ advantageously has an optimum ratio between the green proportion, which increases the brightness, and a wide wavelength distribution for obtaining the largest possible color space. In particular, the dominant wavelength of the second converter $3b$ is optimized to the eye sensitivity, while the first converter $3a$ is used for correcting the color locus. In this regard, a maximum brightness can be obtained, without losses occurring as a result of different absorption effects at the converters $3a$, $3b$. In particular, the first converter $3a$ and the second converter $3b$ advantageously have an identical or almost identical absorption spectrum. As a result, advantageously there is no need for readjustment of the converters $3a$, $3b$ at different excitation wavelengths, which, advantageously, does not increase the production outlay unnecessarily. In particular, the combination of the first and second converters $3a$, $3b$ is optimized to brightness and color space independently of the different, product-identical semiconductor chip wavelength.

The exemplary embodiment in FIG. 2 differs from the exemplary embodiment in FIG. 1 in that the first converter $3a$ and the second converter $3b$ form a common converter mixture. By way of example, the first converter $3a$ and the second converter $3b$ are integrated in a common converter lamina and/or embedded preferably homogeneously in a common matrix material. On the coupling-out side of the semiconductor chip 1, therefore, rather than two converter laminae being applied vertically one above the other, only one converter lamina having the integrated two converters is applied.

For the rest, the exemplary embodiment in FIG. 2 substantially corresponds to the exemplary embodiment in FIG. 1.

FIG. 3 illustrates one exemplary embodiment of a module comprising a plurality of semiconductor components, which, by way of example, are arranged alongside one another on a carrier substrate 2. The semiconductor components in FIG. 3 can be configured, for example, in each case according to the semiconductor component in accordance with the exemplary embodiment in FIG. 1 and/or in FIG. 2. The components accordingly each comprise a semiconductor chip 1, downstream of which in each case the first converter $3a$ and second converter $3b$ are disposed in the emission direction. The components are preferably arranged alongside one another in a row on the carrier substrate.

A common optical element 4 is disposed downstream of the semiconductor chips 1 of the components in the emission direction. The optical element 4 is an optical waveguide, for example, which preferably contains scattering centers. The scattering centers are preferably suitable for scattering the radiation emitted by the semiconductor components homogeneously in all spatial directions.

The beams emitted by the semiconductor chip 1 of the semiconductor components and the converted beams are jointly coupled into the common optical waveguide 4, wherein the spectral constituents of the radiations are mixed in the optical waveguide 4. In particular, the blue radiation emitted by the semiconductor chip 1, the yellow and/or yellow-orange radiation converted by the first converter $3a$ and the green radiation converted by the second converter $3b$ jointly couple into the optical waveguide 4 and are mixed preferably homogeneously there. Such beams which are coupled into an optical waveguide and mixed there can be used for backlighting televisions and computer monitors, for example.

The invention is not restricted to the exemplary embodiments by the description on the basis of said exemplary embodiments, but rather encompasses any novel feature and also any combination of features, which in particular includes any combination of features in the patent claims, even if these features or these combinations themselves are not explicitly specified in the claims or exemplary embodiments.

This patent application claims the priority of German Patent Application 102011113802.5, the disclosure content of which is hereby incorporated by reference.

The invention claimed is:

1. An optoelectronic semiconductor component comprising a semiconductor chip, wherein
   the semiconductor chip has an active layer suitable for generating radiation and suitable for emitting radiation in the blue wavelength range,
   a first converter comprising a Ce doping is disposed downstream of the semiconductor chip in the emission direction,
   a second converter comprising a Ce doping of at most 1.5% is disposed downstream of the semiconductor chip in the emission direction,
   the first converter has a higher Ce doping than the second converter,
   the first converter has a dominant wavelength of the electromagnetic radiation emitted by the first converter during operation in a range of between 565 nm and 575 nm inclusive,
   the second converter has a dominant wavelength of the electromagnetic radiation emitted by the second converter during operation in a range of between 550 nm and 560 nm inclusive,
   the first converter and the second converter have an identical or almost identical absorption spectrum, and
   the first converter is a YAG or TAG converter, and the second converter is a YAG converter.

2. The semiconductor component according to claim 1, wherein the first converter and the second converter form a common converter mixture.

3. The semiconductor component according to claim 1, wherein the first converter comprises a Ce doping of at least 2.5%.

4. The semiconductor component according to claim 1, wherein the first converter converts at least part of the radiation emitted by the semiconductor chip into radiation in the yellow or yellow-orange wavelength range.

5. The semiconductor component according to claim 1, wherein the second converter converts at least part of the radiation emitted by the semiconductor chip into radiation in the green wavelength range.

6. The semiconductor component according to claim 1, wherein the first converter or the second converter is embodied as converter lamina(e).

7. The semiconductor component according to claim 1, wherein the first or second converter is a $Y_3Al_5O_{12}:Ce^{3+}$-based converter.

8. The semiconductor component according to claim 1, wherein the dominant wavelength of the first converter is suitable for correcting the color locus.

9. The semiconductor component according to claim 1, wherein the dominant wavelength of the second converter is adapted to the eye sensitivity of the human eye.

10. An optoelectronic semiconductor component comprising a semiconductor chip, wherein
   the semiconductor chip has an active layer suitable for generating radiation and suitable for emitting radiation in the blue wavelength range,
   a first converter comprising a Ce doping is disposed downstream of the semiconductor chip in the emission direction,
   a second converter comprising a Ce doping of at most 1.5% is disposed downstream of the semiconductor chip in the emission direction,
   the first converter has a higher Ce doping than the second converter,
   the first converter has a dominant wavelength of the electromagnetic radiation emitted by the first converter during operation in a range of between 565 nm and 575 nm inclusive,
   the second converter has a dominant wavelength of the electromagnetic radiation emitted by the second converter during operation in a range of between 550 nm and 560 nm inclusive, and
   the first converter and the second converter have an identical or almost identical absorption spectrum.

11. A display device comprising:
   an LCD panel, and
   an optoelectronic semiconductor component according to claim 10,
   wherein the optoelectronic semiconductor component backlights the LCD panel.

\* \* \* \* \*